(12) United States Patent
Sakai

(10) Patent No.: US 6,249,114 B1
(45) Date of Patent: Jun. 19, 2001

(54) ELECTRONIC COMPONENT CONTINUITY INSPECTION METHOD AND APPARATUS

(75) Inventor: Hiroshi Sakai, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/138,715

(22) Filed: Aug. 24, 1998

(30) Foreign Application Priority Data

Aug. 25, 1997 (JP) .................................................. 9-227682

(51) Int. Cl.$^7$ .................................................. G01R 31/02
(52) U.S. Cl. .......................... 324/72.5; 324/754; 324/537
(58) Field of Search .................... 324/754, 72.5, 324/133, 537; 439/482

(56) References Cited

U.S. PATENT DOCUMENTS

| | | | |
|---|---|---|---|
| 4,894,605 | * | 1/1990 | Ringleb et al. ...................... 324/537 |
| 5,166,602 | * | 11/1992 | Byford et al. ........................ 324/754 |
| 5,397,996 | * | 3/1995 | Keezer ................................. 324/754 |
| 5,506,510 | * | 4/1996 | Blumenau ............................ 324/754 |

FOREIGN PATENT DOCUMENTS

| | | | |
|---|---|---|---|
| 56-110060 | 9/1981 | (JP) | ................................. G01R/31/02 |
| 60-1574 | 1/1985 | (JP) | ................................. G01R/31/02 |
| 63-76341 | 4/1988 | (JP) | ................................. H01L/21/66 |
| 3283599 | 12/1991 | (JP) | ................................. H05K/3/46 |
| 645718 | 2/1994 | (JP) | ................................. H05K/1/11 |
| 7170038 | 7/1995 | (JP) | ................................. H05K/1/02 |
| 837357 | 2/1996 | (JP) | ................................. H05K/1/18 |

\* cited by examiner

*Primary Examiner*—Glenn W. Brown
(74) *Attorney, Agent, or Firm*—Hayes, Soloway, Hennessey, Grossman & Hage, PC

(57) ABSTRACT

A continuity inspection method and apparatus for continuity inspection of a printed circuit board that has a high-density wiring pattern, or for inspection of semiconductor components that have bump electrodes. The method and apparatus employ inspection probe having multiple contacts capable of making simultaneous contact with a plurality of terminals or bumps, which are disposed in mutual proximity on an electronic component or wiring board.

8 Claims, 4 Drawing Sheets

Fig. 4 - PRIOR ART
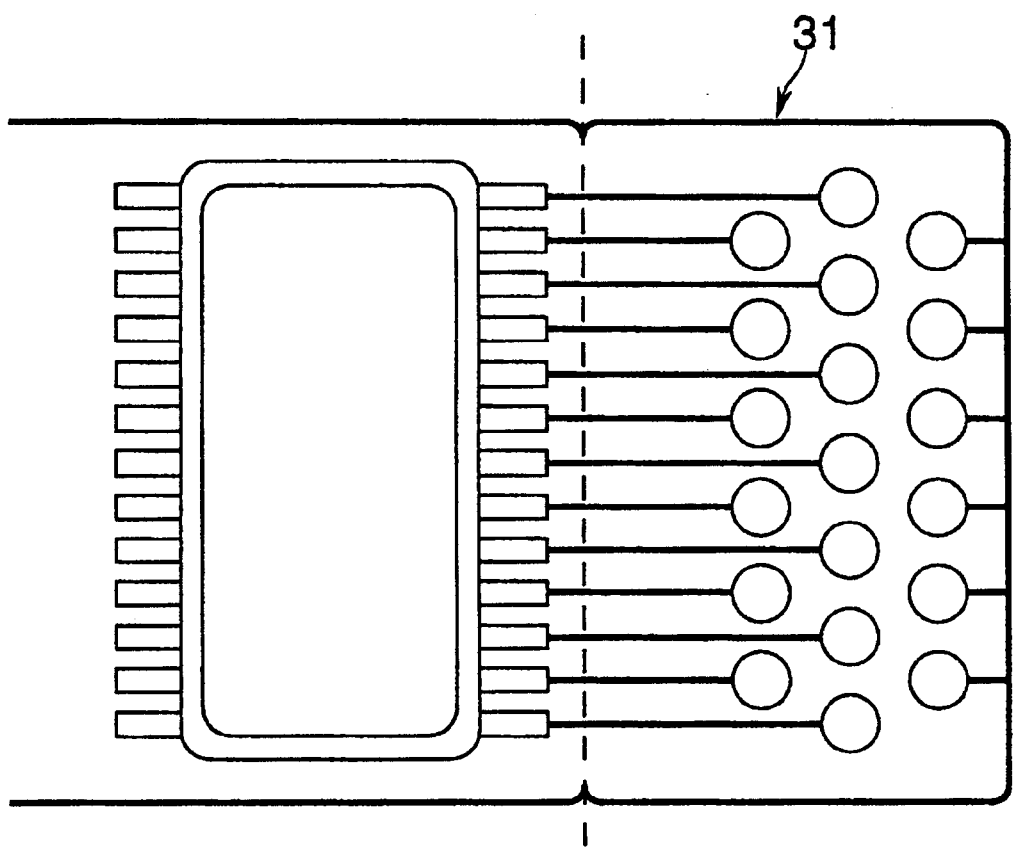

ELECTRONIC COMPONENT CONTINUITY INSPECTION METHOD AND APPARATUS

BACKGROUND OF THE INVENTION

1. Field of the Invention

The present invention relates to a inspection method and apparatus for continuity inspection of electronic components used in electronic equipment.

More specifically, it relates to an inspection method and apparatus for quick and low-cost continuity inspection of semiconductor components of a printed circuit board that has a high-density wiring pattern and of semiconductor components that have bump electrodes.

2. Description of Related Art

A printed circuit board is has a wiring pattern that is made of a foil of copper, silver or the like on top of either a board that is rigid or flexible, this type of board being widely used for the internal components of electronic equipment.

The continuity inspection of various parts of such a printed circuit board is an important process from the standpoint of assuring product reliability.

At present, with the reduction in size of electronic equipment, advances are being made in the achievement of high-density printed circuit boards, this bringing with it wiring patterns that are becoming finer and finer.

In the past, continuity inspection of printed circuit boards was performed by causing an inspection probe to make contact with each of the terminals formed in the wiring pattern of the printed circuit board.

As printed circuit board density becomes greater, however, many high-cost micro-inspection probes are required for continuity inspection of a printed circuit board, thus resulting in an increase in the cost of inspection To accommodate the problem of higher density printed circuit boards, the Japanese Unexamined Patent Publication (KOKAI) Nos. 3-283599 and 6-45718, as shown in FIG. 4, propose printed circuit board continuity inspection methods which use a redundant part 31, which has an inspection pad and which can be removed after use in a continuity inspection.

While prior art printed circuit board continuity inspection methods of Japanese Unexamined Patent Publication Nos. 3-283599 and 6-45718 enable the achievement of a sufficient inspection pad size, regardless of the high density of the printed circuit board, because these methods require that a redundant part 31 be provided on the printed circuit board, they involve the same problem of a rise in cost as noted for the case of using a microprobe for inspection.

For the continuity inspection of printed circuit boards that are becoming denser and denser, the approaches in the past have been those of using high-cost microprobes or providing the printed circuit board with a redundant part using for continuity inspection. Both of these methods, however, lead to significant increases in cost.

An object of the present invention is to provide a continuity inspection method and apparatus which solve the problems involved with the prior art as described above, and which can accommodate electronic components, and in particular high-density printed circuit boards.

Another object of the present invention is to provide a printed circuit board that is suitable for the above-noted method.

SUMMARY OF THE INVENTION

To achieve the above-noted objects, a method according to the present invention is a continuity inspection method whereby a contact inspection probe having multiple contacts that can make simultaneous contact is caused to cone into contact with a plurality of terminals that are provided in mutual proximity on an electronic component.

Additionally, to solve the above-noted problems, an apparatus according to the present invention has a contact inspection probe which has multiple contacts that can make simultaneous contact with a plurality of terminals that are provided in mutual proximity on an electronic component.

A printed circuit board according to the present invention that solves the above-noted problem is a printed circuit board that is provided with a plurality of terminals, which are grouped into a plurality of groups in concentration at a prescribed location on the printed circuit board.

A printed circuit board continuity inspection method and apparatus according to the present invention cause a contact inspection probe which has multiple contacts that can make simultaneous contact is caused to come into contact with a plurality of terminals that are provided in mutual proximity on an electronic component sad, according to the present Invention, it is possible to perform continuity inspection of a plurality of wiring pattern parts, either successively or simultaneously.

According to the present invention, because electrical continuity is inspected by causing 1 common probe to come into contact with a plurality of terminals, even if the terminals or inspection pads become very small and with a narrow pitch therebetween, it is possible to use a low-cost probe to perform a continuity inspection of a higher density printed circuit board, without the need for a high-cost microprobe.

BRIEF DESCRIPTION OF THE DRAWINGS

FIG. 4 is a drawing which shows a printed circuit board of the past, which has a redundant part having inspection pads.

DETAILED DESCRIPTION OF THE PREFERRED EMBODIMENTS

Figure 1:
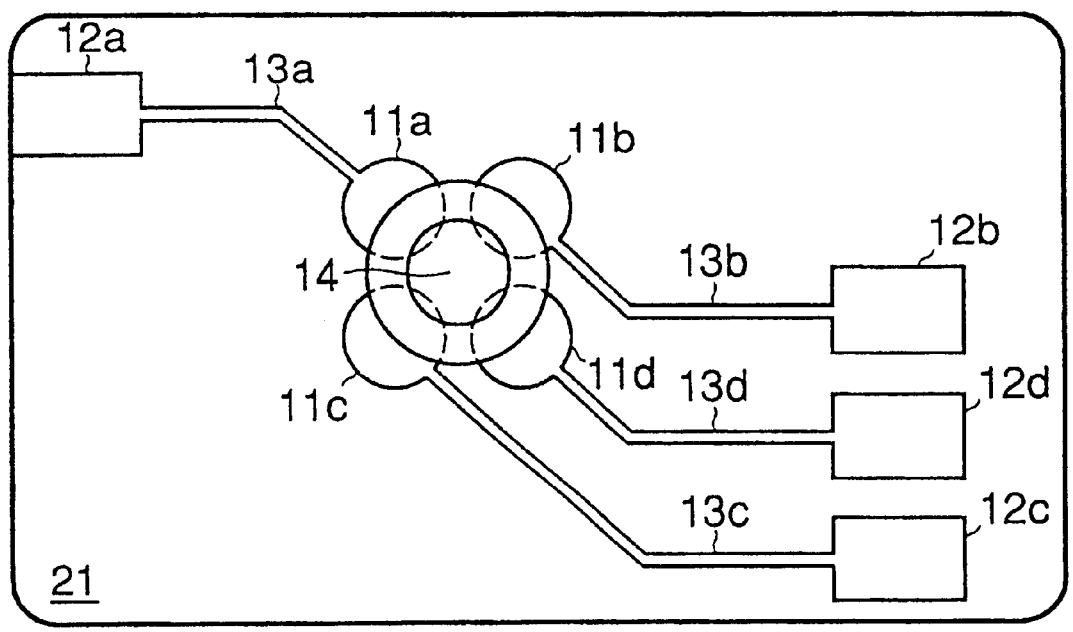
FIG. 1 is a plan view of a example of application of the present invention to a printed circuit board.
Figure 2:
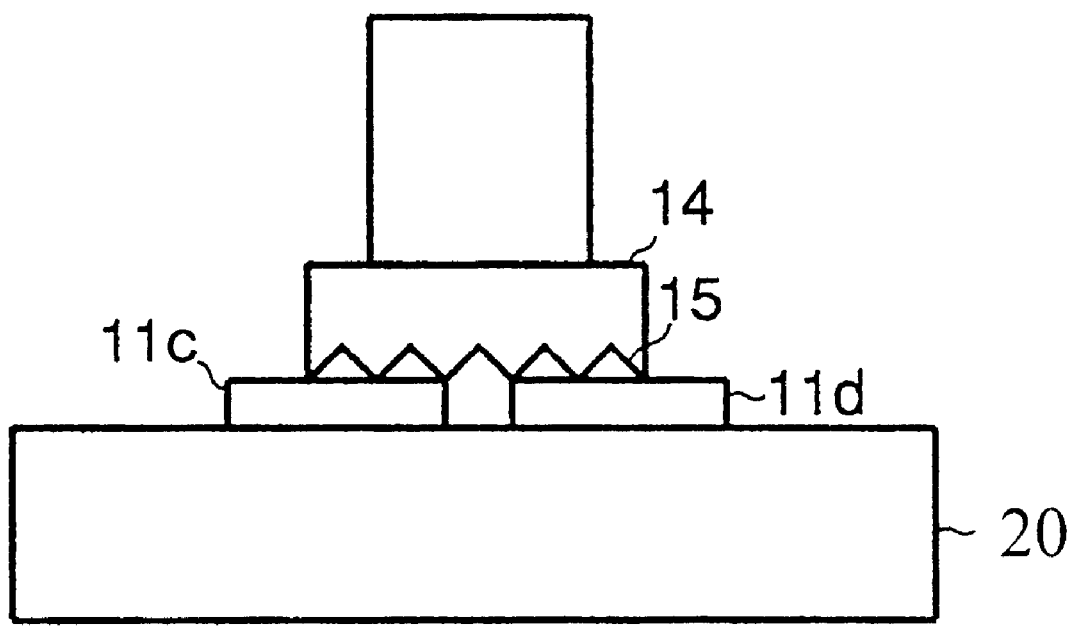
FIG. 2 is a side view of a specific example of FIG. 1.

Embodiments of the present invention are described below, with reference being made to the relevant accompanying drawings. FIG. 1 is a plan view which shows an example of the present invention, and FIG. 2 is a side view of a specific example of FIG. 1.

As shown in FIG. 1, in an exile of the printed circuit board continuity inspection method according to the present invention, an inspection probe 14, which has multiple contacts that can make simultaneous contact, is brought into contact with a plurality of terminals 11a through 11d, which are provided in mutual proximity on an electronic component or printed circuit board 21.

The term "terminal" as used herein includes any part of a wiring pattern than can make physical contact with a probe, this encompassing a lead pattern, a wire bonding pad, a die-bonding pad, a pad for external terminal connection, a pad for an electronic component, an Inspection pad, a bump electrode, and a ball grid array or the like.

Additionally, this also includes a terminal within a socket that is mounted on the printed circuit board, as long as it is connected to a plurality of wires.

A wiring pattern of copper, silver or the like is applied to the printed circuit board substrate 21 using a known method, as shown in FIG. 1.

A first wiring pattern includes a pad 11a, which serves also as an inspection pad, a wire 13a, and an electronic component connection pad 12a, which is an external terminal or for the purpose of making connection with another electronic component.

A second wiring pattern includes a terminal 11b, which serves also as an inspection pad, a wire 13b, and an electronic component connection pad 12b, which is an external terminal or is for the purpose of making connection with another electronic component.

A third wiring pattern includes a terminal 11c, which serves also as an inspection pad, a wire 13c, and an electronic component connection pad 12c, which is an external terminal or is for the purpose of making connection with another electronic component.

A fourth wiring pattern includes a terminal 11d, which serves also as an inspection pad, a wire 18d, and an electronic component connection pad 12d, which is an external terminal or is for the purpose of making connection with another electronic component.

In a printed circuit board according to the present invention, as shown in FIG. 1, the terminals 11a through 11d, which serve also as inspection pads, are provided and disposed in a concentrated manner.

These terminals 11a through 11d are grouped close together in a specific arrangement for the purpose of a printed circuit board continuity inspection.

The concentrated region, including such terminals, each serving as an inspection pad, therein, can be provided in any portion of the substrate 21 and a plurality of terminals can be also provided in a concentrated area.

By disposing this highly concentrated region within the component mounting area, the need to have wiring leading out to a redundant part as done in the prior art is eliminated, thereby simplifying the design of the wiring pattern.

Although the number of terminals in the above-noted concentrated group thereof and the shape of the group are arbitrary, it is preferable that the terminals be disposed within a region of a size which enables simultaneous contact by a single probe. The shape of the pads or terminals 11a through 11d may be arbitrary.

In FIG. 1, the four inspection pad 5 or terminals 11a through 11d are shown as circular in shape.

In this case, the contact tips of the multipoint inspection probe preferably are arranged a circular, elliptical, or rectangular plan.

However, in accordance with the number and arrangement shape of the inspection pads, it is possible for the contact tips of the inspection probe to be a different shape, for example stripe shaped or another arbitrary shape.

In a continuity inspection method of the prior art, it was necessary to bring four separate microprobes into contact with the inspection pads or the terminals 11a through 11d, whereas with the present invention it is only necessary to have a single multi-point inspection probe for a plurality of inspection pads or terminals.

In a continuity inspection method according to the present invention, with respect to a printed circuit board on which, as described above, inspection pads or terminals 11a through 11d are provided for the purpose of continuity inspection in proximity so as to form a grouping thereof, a multi-point inspection probe 14 is brought caused to come into contact with all the inspection pads 11a through 11d.

In order to prevent a faulty contact caused by variation in the thickness of the foil which forms each part of the wiring pattern, the multi-point inspection probe 14, as shown in FIG. 2, preferably has many depressions and protrusions on the end 15 thereof.

As a result, by virtue of the resilience between the uneven surface and the wiring pattern, it is possible to achieve a reliable contact with all the inspection pads or terminals 11a through 11d.

According to the present invention, by either bringing four microprobes into contact with the external terminals or electronic component connection pads 12a through 12d or connecting an appropriate power supply thereto, it is possible to perform a go/ao-go continuity test between the multi-point inspection probe 14 and the external terminals or electronic component connection pads 12a through 12d.

The method of the present invention can be performed either before or after mounting components to a printed circuit board.

In particular when the method of the present invention is applied after mounting of components to a printed circuit board, it is possible to perform not only a continuity test of the wiring pattern, but simultaneously to conduct a performance test and adjustments with respect to mounted components.

The present invention can also be applied to multiple layer printed circuit boards that have through holes.

Figure 3:
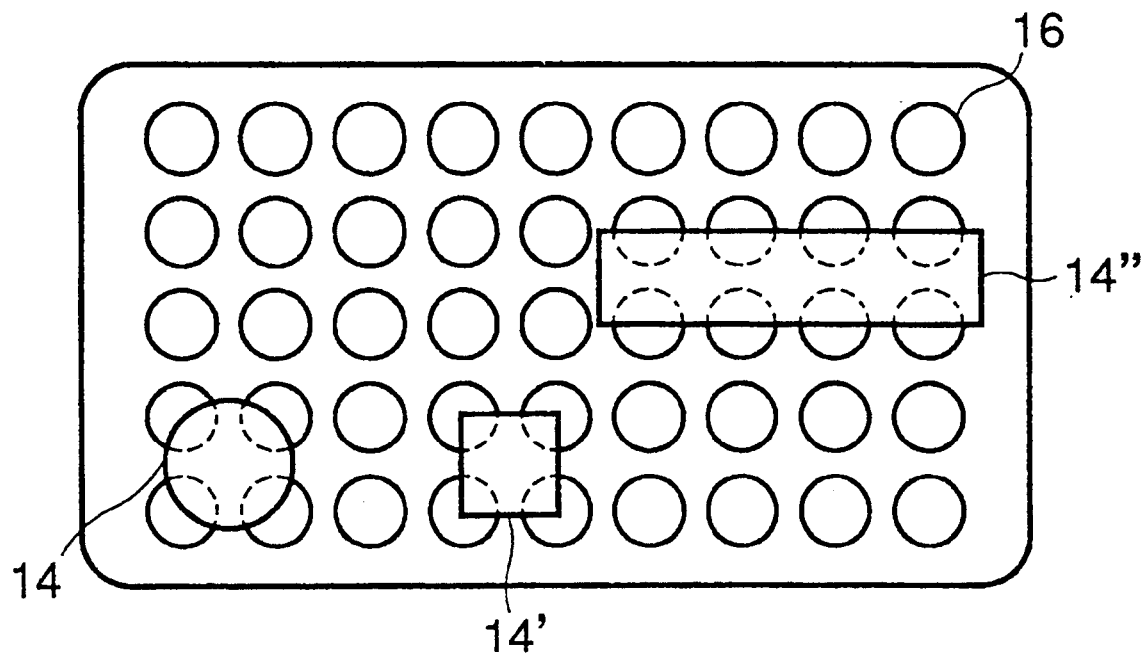
FIG. 3 is a plan view which shows an example of application of the present invention to a bump electrode.

In particular, as shown in FIG. 3 it is possible to use the present invention for the purpose of inspecting the continuity between ball bump electrodes 16 for components of a high level of integration, using the method of a ball grid array (BGA) and wires of the wiring pattern that are connected thereto as shown in FIG. 3, the multi-point inspection probe may be, for example, round in plan (probe 14), square in plan (probe 14'), or rectangular in plan (probe 14").

According to the present invention, by causing a single common probe to come into contact with a plurality of terminals in performing an electrical continuity inspection, even in the case of extremely small terminals or inspection pads and narrow pitch therebetween, it is possible to perform a lowcost continuity inspection of a high-density printed circuit board, without the need for high-cost microprobes.

What is claimed is:

1. A method of testing continuity of electrical circuits on an electronic component having a plurality of electrical circuits thereon, which comprises providing each electrical circuit with a separate inspection pad, and locating a plurality of said inspection pads adjacent one another on said component; providing a multi-point inspection probe of a size large enough to bridge several of said inspection pads; and bringing said multi-point inspection probe in simultaneous electrical contact with said several of said inspection pads and performing an electrical continuity inspection thereof.

2. A method according to claim 1, wherein said inspection pads are located adjacent one another in circular groupings.

3. A method according to claim 1, wherein said inspection probe comprises a multi-point probe having points arranged spaced from one another in a round plan.

4. A method according to claim 1, wherein said inspection probe comprises a multi-point probe having points arranged in rectangular plan.

5. A method according to claim 1, wherein said inspection probe comprises a multi-point probe having points arranged in a stripe plan.

6. The method according to claim 1, wherein said electrical continuity inspection comprises a go/no-go continuity test between said multi-point inspection probe and external terminals of electronic component inspection pads located on a circuit board.

7. The method according to claim 1, wherein said electronic component comprises a printed circuit board.

8. The method according to claim 1, wherein said electronic component comprises a semiconductor device having a plurality of bump terminals.

* * * * *